United States Patent
Sano et al.

(10) Patent No.: US 11,107,787 B2
(45) Date of Patent: Aug. 31, 2021

(54) MEMBER FOR SEMICONDUCTOR DEVICE

(71) Applicant: FUJI ELECTRIC CO., LTD., Kawasaki (JP)

(72) Inventors: Shinji Sano, Matsumoto (JP); Yoshihiro Kodaira, Matsumoto (JP); Masayuki Soutome, Matsumoto (JP); Kazunaga Onishi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/184,451

(22) Filed: Nov. 8, 2018

(65) Prior Publication Data
US 2019/0081020 A1 Mar. 14, 2019

Related U.S. Application Data

(63) Continuation of application No. 15/364,702, filed on Nov. 30, 2016, now Pat. No. 10,153,246.

(30) Foreign Application Priority Data

Jan. 15, 2016 (JP) .................................. 2016-006148

(51) Int. Cl.
*H01L 23/00* (2006.01)
*H01L 23/373* (2006.01)
(Continued)

(52) U.S. Cl.
CPC .......... *H01L 24/27* (2013.01); *H01L 21/4853* (2013.01); *H01L 21/4857* (2013.01); *H01L 23/3735* (2013.01); *H01L 23/48* (2013.01); *H01L 24/29* (2013.01); *H01L 24/32* (2013.01); *H01L 24/83* (2013.01);
(Continued)

(58) Field of Classification Search
None
See application file for complete search history.

(56) References Cited

U.S. PATENT DOCUMENTS 3,855,275 A * 12/1974 Winnick ............. C08G 63/183
560/79
6,232,657 B1 * 5/2001 Komorita ................ H01L 23/15
257/700

(Continued)

FOREIGN PATENT DOCUMENTS

| CN | 1537327 A | 10/2004 |
|---|---|---|
| JP | H10-65292 A | 3/1998 |

(Continued)

OTHER PUBLICATIONS

Japan Patent Office, "Office Action for Japanese Patent Application No. 2016-006148," dated Aug. 20, 2019.

(Continued)

*Primary Examiner* — Anthony Ho
*Assistant Examiner* — Kevin Quinto
(74) *Attorney, Agent, or Firm* — Manabu Kanesaka

(57) ABSTRACT

A member for semiconductor device includes a metal portion configured to be bonded to another member by solder, and a treated coating covering a surface of the metal portion, the treated coating including a treatment agent. The treated coating vaporizes at a temperature lower than or equal to a solidus temperature of the solder.

9 Claims, 6 Drawing Sheets

(51) Int. Cl.
*H01L 23/48* (2006.01)
*H01L 21/48* (2006.01)

(52) U.S. Cl.
CPC .. *H01L 21/4875* (2013.01); *H01L 2224/2712* (2013.01); *H01L 2224/2746* (2013.01); *H01L 2224/291* (2013.01); *H01L 2224/2969* (2013.01); *H01L 2224/29111* (2013.01); *H01L 2224/29116* (2013.01); *H01L 2224/29561* (2013.01); *H01L 2224/321* (2013.01); *H01L 2224/32227* (2013.01); *H01L 2224/32501* (2013.01); *H01L 2224/83002* (2013.01); *H01L 2224/83065* (2013.01); *H01L 2224/83101* (2013.01); *H01L 2224/83192* (2013.01); *H01L 2224/83395* (2013.01); *H01L 2224/83815* (2013.01); *H01L 2924/014* (2013.01)

(56) References Cited

U.S. PATENT DOCUMENTS

| | | | |
|---|---|---|---|
| 6,344,407 B1* | 2/2002 | Matsuki | B23K 35/38 228/180.22 |
| 7,926,700 B2 | 4/2011 | Schmitt et al. | |
| 2002/0142517 A1* | 10/2002 | Maeda | H01L 24/81 438/108 |
| 2003/0116837 A1 | 6/2003 | Fukatani et al. | |
| 2004/0152238 A1 | 8/2004 | Maeda et al. | |
| 2004/0261904 A1* | 12/2004 | Chen | B23K 35/3613 148/23 |
| 2005/0217757 A1* | 10/2005 | Miyano | B23K 35/3612 148/24 |
| 2013/0049158 A1* | 2/2013 | Hong | H01L 31/035281 257/466 |
| 2014/0027885 A1* | 1/2014 | Kawase | H01L 21/563 257/632 |
| 2018/0326545 A1 | 11/2018 | Hayashi et al. | |

FOREIGN PATENT DOCUMENTS

| | | |
|---|---|---|
| JP | 2003-197827 A | 7/2003 |
| JP | 2005-509269 A | 4/2005 |
| JP | 2006-222381 A | 8/2006 |
| JP | 2009-514683 | 4/2009 |
| JP | 2012-114429 A | 6/2012 |
| JP | 2012-160539 A | 8/2012 |
| JP | 6042956 B1 | 12/2016 |

OTHER PUBLICATIONS

China Patent Office, "Office Action for Chinese Patent Application No. 201611093776.8;" dated Jan. 22, 2021.

* cited by examiner

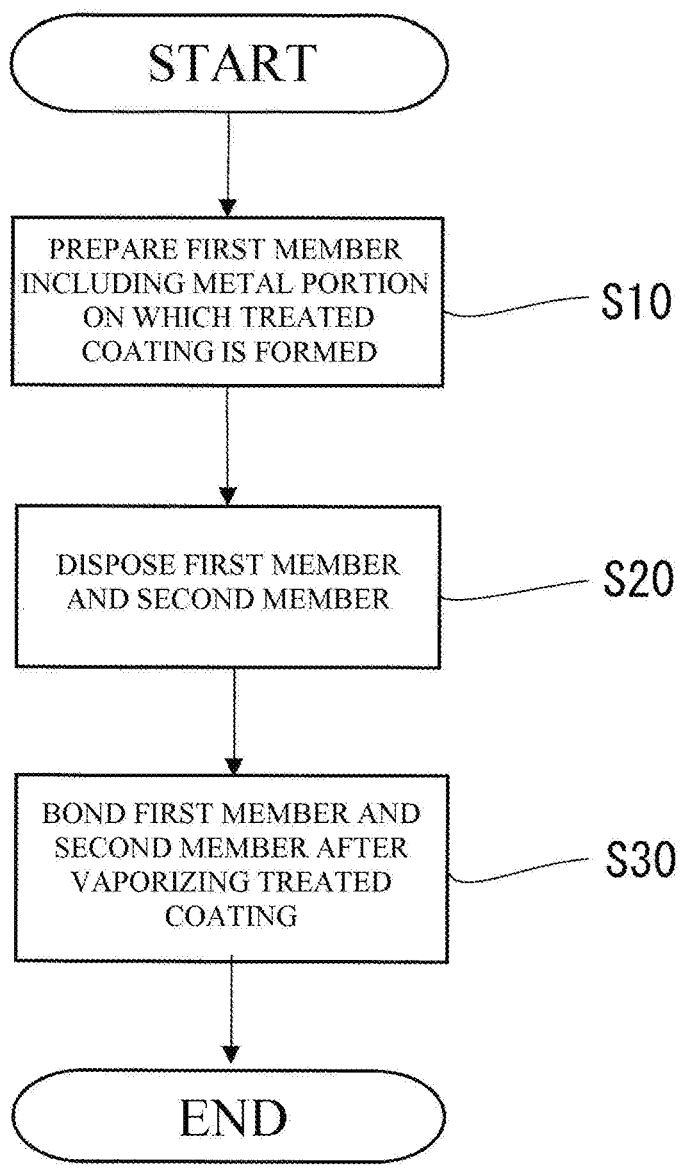

MEMBER FOR SEMICONDUCTOR DEVICE

CROSS-REFERENCE TO RELATED APPLICATION(S)

The present application is a continuation application of Ser. No. 15/364,702 filed on Nov. 30, 3016, which is based on, and claims priority from, Japanese Application No. JP2016-006148 filed Jan. 15, 2016, the disclosure of which is hereby incorporated by reference herein in its entirety.

TECHNICAL FIELD

The present invention relates to a the member for semiconductor device. The member for semiconductor device can be used for semiconductor devices such as for power semiconductor modules.

BACKGROUND ART

One example of power semiconductor modules is provided with a multilayer substrate having an insulating plate and a circuit plate, a semiconductor chip having a front surface having an electrode and a back surface fixed to the circuit plate, and a connection terminal. The multilayer substrate has an integrated structure configured by the circuit plate disposed on the front surface of the insulating plate and a metal plate disposed on the back surface thereof. Raw materials of the circuit plate and metal plate are generally copper and aluminum. The semiconductor chip is bonded to the circuit plate by solder. The connection terminal may be bonded to the circuit plate by solder. Further, a heat sink may also be bonded to the metal plate by solder.

For assembling the power semiconductor module, solder is disposed at a position for bonding the semiconductor chip on the circuit plate of the multilayer substrate, and then, the semiconductor chip is disposed on the solder, followed by heating and melting the solder for bonding. The situation is the same for bonding the connection terminal to the circuit plate by solder. Further, the metal plate of the multilayer substrate and the heat sink are bonded to each other by solder which is disposed therebetween and then molten by heating.

The surfaces of the circuit plate and the metal plate of the multilayer substrate may be covered, before solder-bonding, with a rust preventive for prevention from oxidation and corrosion. Benzotriazole-based rust preventives are generally used as such rust preventives (Patent document 1).

RELATED ART DOCUMENT

Patent Document

Patent document 1: Japanese Unexamined Patent Application Publication No. 2012-114429

SUMMARY OF THE INVENTION

Problems to be Solved by the Invention

A rust-resistant coating formed on the surface of the circuit plate or the metal plate of the multilayer substrate by using a benzotriazole-based rust preventive may remain on the surface of the circuit plate or the metal plate and inhibit solder wettability during solder-bonding, or vaporize to generate foams which in turn become a large number of voids in the solder during solder-bonding. A large number of voids in the solder may decrease the mechanical reliability of solder-bonded portions or increase thermal resistance, leading to insufficient performance of the power semiconductor module.

In addition, the rust-resistant coating of Patent document 1 contains organic halide on its surface, and the organic halide remaining in the solder-bonded portion is likely to cause corrosion under an environment having high temperature and high humidity and deterioration of insulating property under a biased environment having high temperature and high humidity. Removal of the organic halide by cleaning before solder-bonding is expected to increase production cost.

A multilayer substrate exists which is free from rust preventives on the surface of its metal plate or circuit plate. However, the multilayer substrate free from rust preventives is likely to cause a chemical alteration such as oxidation and corrosion on the surface of the circuit plate or the metal plate during storage of the multilayer substrate or during transport thereof before soldering.

Power semiconductor modules have been recently required to achieve high electric current density and to guarantee associating high temperature operation, and the number of voids in their solder-bonded portion is required to be as small as possible. In addition, it is preferable to decrease the number of voids in not only the multilayer substrate of power semiconductor modules but also the solder-bonded portion in order to improve the reliability of the solder-bonded portion.

The present invention is to solve the above-mentioned problems advantageously, and an object of the invention is to provide a method for producing a member for semiconductor device and the semiconductor device, which can prevent the generation of a large number of voids in the solder-bonded portion without increase in production cost, and the member for semiconductor device.

Means for Solving the Problems

The present invention is a member for semiconductor device comprising a metal portion configured to be bonded to another member by solder, and a treated coating covering a surface of the metal portion, the treated coating including a treatment agent, wherein the treated coating vaporizes at a temperature lower than or equal to a solidus temperature of the solder.

In the member for semiconductor device a vaporization temperature of the treated coating is in a range from 80 to 250° C.

Effect of the Invention

According to the present invention, the first member includes the metal portion to be bonded by solder, and a treated coating is formed on the surface of the metal portion by using a treatment agent, the treated coating vaporizing at a temperature lower than or equal to the solidus temperature of the solder, thereby vaporizing the treated coating before melting of the solder during solder-bonding and reducing generation of a large number of voids in the solder-bonded portion.

BRIEF DESCRIPTION OF THE DRAWINGS

FIG. 7 is a flow chart explaining a production method according to Embodiment 2 of the present invention.

MODE FOR CARRYING OUT THE INVENTION

Embodiment 1

Now, an explanation will be made, with reference to the drawings, for Embodiment 1 of the method for producing a member for semiconductor device of the present invention and the member for semiconductor device.

Figure 1:
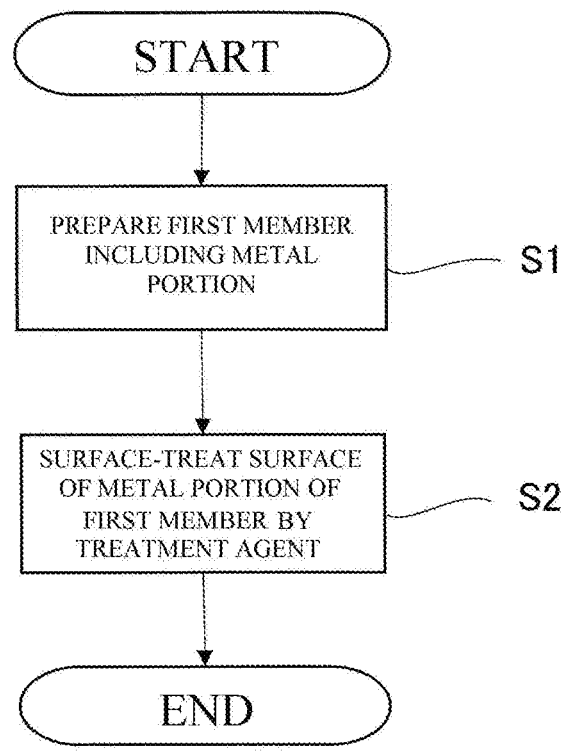
FIG. 1 is a flow chart explaining a production method according to Embodiment 1 of the present invention.

FIG. 1 illustrates a flow chart explaining the production method of Embodiment 1 of the present invention. First, a first member including a metal portion which can be bonded by solder is prepared (S1). Then, the surface of the metal portion of the first member is surface-treated by a treatment agent (S2).

In the present invention, the member for semiconductor device is a member which has a first member including a metal portion which has a surface covered by a treated coating. The metal portion can be bonded to a second member by solder. In other words, the member for semiconductor device includes the first member and includes the treated coating on the surface of the first member. The treated coating may cover the surface of the first member other than the metal portion.

Figure 2:
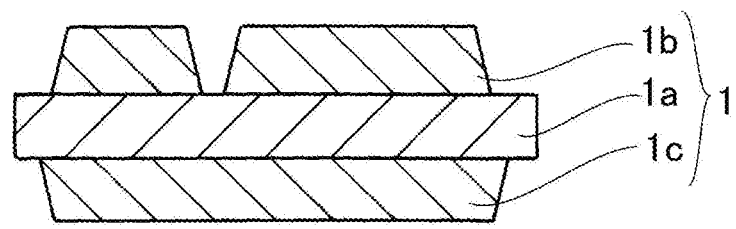
FIG. 2 is a schematic cross-sectional view of a multilayer substrate.

The step S1 will be explained with reference to a schematic cross-sectional view of a multilayer substrate 1 which is one example of the first member of this embodiment illustrated in FIG. 2. The multilayer substrate 1 is used for a semiconductor device, and more specifically for a power semiconductor module. In FIG. 2, the multilayer substrate 1 has a stacked structure configured by a insulating plate 1a, a circuit plate 1b placed on the front surface of the insulating plate 1a, in other words, the main surface, and a metal plate 1c placed on the back surface of the insulating plate 1a. The circuit plate 1b and the metal plate 1c correspond to the metal portion of the first member of this embodiment. After the step S2, one of the circuit plate 1b and the metal plate 1c, or both of them can be bonded to another member by solder.

The insulating plate 1a is made of an insulating ceramic, such as aluminum oxide, silicon nitride, and aluminum nitride. A member containing an insulating resin other than the insulating ceramics, such as polyimide and a glass epoxy material can also be used for the insulating plate 1a.

The circuit plate 1b is formed selectively on the front surface of the insulating plate 1a, thereby configuring a given electric circuit. The circuit plate 1b is made of copper, a copper alloy, aluminum, an aluminum alloy, and so on. The metal plate 1c is formed on the back surface of the insulating plate 1a. The metal plate 1c is made of copper, a copper alloy, aluminum, an aluminum alloy, and so on.

A DCB (Direct Copper Bonding) substrate or the like can be used for the multi-layered substrate 1. The DCB substrate is a substrate including the insulating plate 1a, and the circuit plate 1b and the metal plate 1c which are directly bonded to the insulating plate. Since the insulating plate 1a is insulative, the circuit plate 1b and the metal plate 1c are electrically insulated from each other.

In the power semiconductor module, the multilayer substrate 1 includes the circuit plate 1b, above the front surface of which is disposed the semiconductor chip 3, as will be described later (See FIG. 5), in such a manner as to face the circuit plate 1b, which is then heated along with the semiconductor chip 3, both kept in contact to solder 4, to be solder-bonded to each other. Further, one end of a connection terminal 5 is disposed in such a manner as to face the front surface of the circuit plate 1b, which is then heated along with the connection terminal 5, both kept in contact to the solder 4, to be solder-bonded to each other. Still further, a heat sink 6 is disposed in such a manner as to face the back surface of the metal plate 1c, which is then heated along with the heat sink 6, both kept in contact to the solder 7, to be solder-bonded to each other. In this embodiment, the semiconductor chip 3, the connection terminal 5, or the heat sink 6 which are solder-bonded to the multilayer substrate 1 corresponds to the second member of the present invention.

Figure 3:
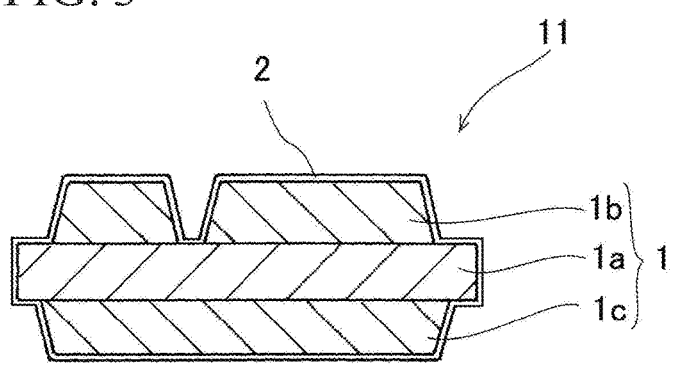
FIG. 3 is a schematic cross-sectional view of a multilayer substrate covered with a treated coating.

The step S2 will be explained with reference to a schematic cross-sectional view of the member for semiconductor device 11 of this embodiment illustrated in FIG. 3. As illustrated in FIG. 3, the surface of the circuit plate 1b of the multilayer substrate 1 illustrated in FIG. 2 is surface-treated by a treatment agent. The surface of the metal plate 1c is also surface-treated by a treatment agent. By these surface-treatments, the member for semiconductor device 11 is produced which has a treated coating 2 covering the surfaces of the circuit plate 1b, the metal plate 1c, and the insulating plate 1a of the multi-layered substrate 1.

The treated coating 2 is a treated coating which vaporizes at a temperature lower than or equal to the solidus temperature of the solder 4 or the solder 7. The treatment agent is a non-benzotriazole-based treatment agent, unlike benzotriazole-based treatment agents which have been conventionally used as rust preventives.

Figure 4:
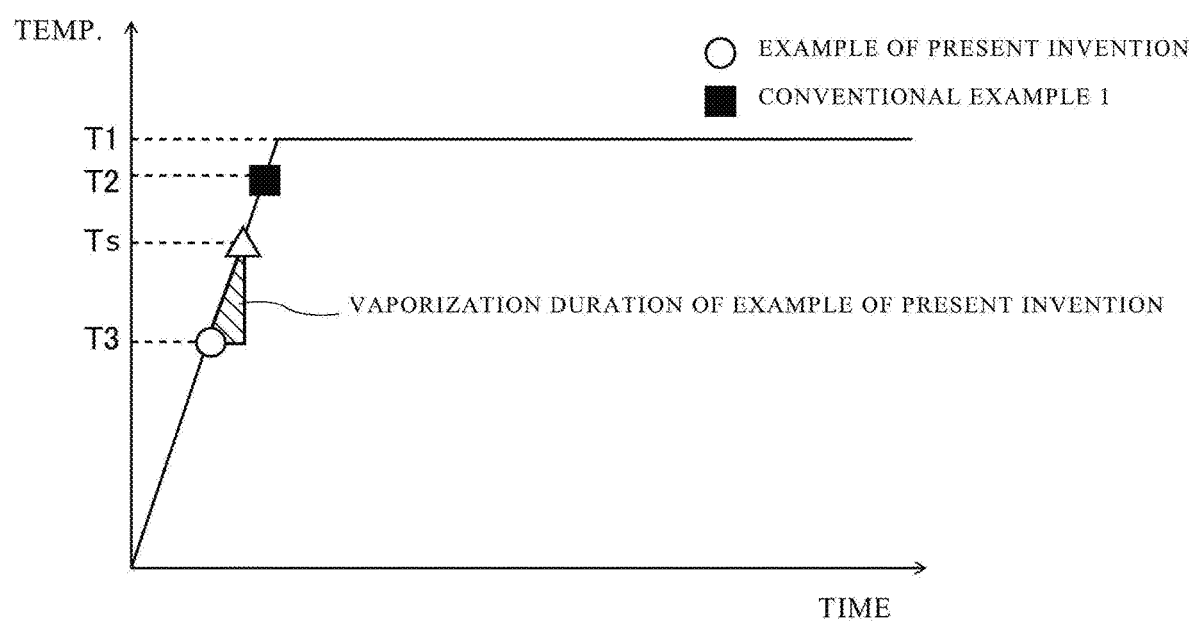
FIG. 4 is a graph indicating a relation of heating temperature with elapsed time during solder-bonding.

FIG. 4 is a graph representing heating temperature and elapsed time during solder-bonding plotted on vertical and horizontal axes, respectively. FIG. 4 is an explanatory graph comparing a conventional example 1 using a conventional treatment agent with an example of the present invention using a treatment agent in the present invention. In FIG. 4, when solder-bonding is carried out, solder is heated from normal temperature to a given temperature T1 enough high for the solder to melt, at which temperature the solder is then kept to be bonded. In a solder-bonding step which carries out the illustrated heating operation, the conventional example 1 using a benzotriazole-based treatment agent conventionally used as a rust preventive has a treated coating having a vaporization temperature T2 which is equal to or higher than the solidus temperature Ts of the solder, in other words, the temperature at which the solder begins melting. For this reason, even after the onset of the melting of the solder, the treated coating continues vaporizing, or remains on the surface of the circuit plate 1b or the metal plate 1c of the member for semiconductor device 11, resulting in inhibition of solder wettability. Accordingly, a large number of voids are likely to be generated in the solder-bonded portion.

In contrast to this, the example of the present invention illustrated in FIG. 4 has a treated coating having a vaporization temperature T3 which is lower than or equal to the solidus temperature Ts of the solder. For this reason, the treated coating finishes vaporization during the temperature elevation from normal temperature to Ts. Accordingly, after the onset of the melting of the solder, the treated coating neither vaporizes nor remains on the surfaces of the circuit plate 1b and the metal plate 1c of the member for semiconductor device 11. Thus, the generation of voids in the solder-bonded portion can be reduced, providing a semiconductor device having a reliable solder bonded portion.

For the conventional example 2, even the benzotriazole-based treatment agent conventionally used as a rust preventive can reduce the generation of voids in the solder after bonding, provided that a heating treatment for vaporization of the treated coating, as a pre-treatment before solder bonding, is carried out for the member for semiconductor device 11 alone. However the pre-treatment causes increase in production steps and production cost. Accordingly, in the present invention, the treated coating illustrated in FIG. 4 is used which vaporizes at a temperature lower than or equal to the solidus temperature Ts of the solder.

The solder to be bonded to the circuit plate 1b or the metal plate 1c of the multilayer substrate 1 is an alloy consisting of Sn and one metal selected from Ag, Cu, Sb, Ni, Ge, P, In, Bi, Zn, and Pb. The solder may contain any unavoidable impurity. The solder may be a lead-containing solder or a lead-free solder. The lead-free solder is preferable because it contains no lead detrimental to human body and has, as a waste, a small influence on natural environments. Examples of suitable component systems for the solder include, for example, a Pb—Sn system, a Pb—Ag—Sn system, a Sn—Sb system, a Sn—Cu system, a Sn—Cu—Ag system, a Sn—Ag system, a Sn—Ag—Cu system, a Sn—Ag—Cu—Ni—Ge system, a Sn—Ag—Cu—Ni—P system, a Sn—Cu—Ni system, a Sn—In—Ag—Bi system, and a Sn—Zn system. Table 1 summarizes exemplary compositions, and solidus and liquidus temperatures of these component systems. Note that "%" in the figure means "% by mass".

TABLE 1

| component system of solder | solidus temperature (° C.) | liquidus temperature (° C.) |
|---|---|---|
| Pb—10%Sn | 268 | 302 |
| Pb—5%Sn | 300 | 314 |
| Pb—1.5%Ag—1%Sn | 309 | 309 |
| Sn—5%Sb | 238 | 241 |
| Sn—0.7%Cu | 227 | 228 |
| Sn—3%Cu | 227 | 309 |
| Sn—6%Cu—2%Ag | 217 | 226 |
| Sn—0.7%Cu—0.3%Ag | 217 | 226 |
| Sn—4%Cu—1%Ag | 217 | 335 |
| Sn—3%Ag | 221 | 222 |
| Sn—3.7%Ag | 221 | 221 |
| Sn—3.5%Ag | 221 | 221 |
| Sn—3%Ag—0.5%Cu | 217 | 219 |
| Sn—3%Ag—0.5%Cu—0.05%Ni—0.02%Ge | 217 | 219 |
| Sn—3%Ag—0.5%Cu—0.05%Ni—0.1%P | 217 | 219 |
| Sn—4%Ag—0.5%Cu | 217 | 219 |
| Sn—3.5%Ag—0.7%Cu | 217 | 217 |
| Sn—3.8%Ag—0.7%Cu | 217 | 217 |
| Sn—0.7%Cu—0.06%Ni | 227 | 230 |
| Sn—0.5%Cu—0.05%Ni | 228 | 231 |

TABLE 1-continued

| component system of solder | solidus temperature (° C.) | liquidus temperature (° C.) |
|---|---|---|
| Sn—4%In—3.5%Ag—0.5%Bi | 207 | 212 |
| Sn—8%In—3.5%Ag—0.5%Bi | 196 | 206 |
| Sn—9%Zn | 198 | 198 |

In the case of using solder having the component compositions shown in Table 1, the treated coating 2 used in the present invention is a treated coating which vaporizes at a temperature lower than or equal to the solidus temperatures shown in Table 1. The vaporization temperature herein is a vaporization temperature at normal pressure (atmospheric pressure) because the heating is usually carried at normal pressure (atmospheric pressure) during solder-bonding. The treated coating 2 more preferably vaporizes at a temperature 10° C. or more lower than the solidus temperature.

Solders used during assembly of a power semiconductor module have a solidus temperature of approximately from 200 to 300° C., as can be understood from Table 1. Accordingly, the treated coating 2 used in the present invention preferably has a vaporization temperature of from 80 to 250° C. because the treated coating 2 can vaporize sufficiently before melting of solder, and the temperature is most suitably from 100 to 200° C. When it is less than 80° C., the vaporization occurs during storage and on the way of transport of the member, making impossible prevention from chemical alteration until just before its use. Note that the vaporization temperature of benzotriazole-based treated coatings conventionally used as rust preventives is from about 250° C. to about 300° C.

Treatment agents used in the present invention contain at least one organic substance selected from a carboxylic acid, a metal salt of carboxylic acid, and a carboxylic acid ester. The carboxylic acid is preferably a fatty acid and the metal salt of carboxylic acid is preferably a metal salt of fatty acid, and the carboxylic acid ester is preferably a fatty acid ester thereof.

Examples of the organic substance specifically include a carboxylic acid, such as formic acid, acetic acid, propanoic acid, butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, icosanoic acid, propenoic acid, butenoic acid, pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, heptadecenoic acid, octadecenoic acid, nonadecenoic acid, icosenoic acid, 2-ethylhexanoic acid, oxalic acid, malonic acid, succinic acid, glutaric acid, adipic acid, pimelic acid, suberic acid, azelaic acid, sebacic acid, undecanedioic acid, dodecanedioic acid, tridecanedioic acid, tetradecanedioic acid, pentadecanedioic acid, hexadecanedioic acid, heptadecanedioic acid, phthalic acid, isophthalic acid, terephthalic acid, malic acid, and citric acid, an alkaline metal salt such as potassium salt and sodium salt, of these carboxylic acids, an ammonium salt of these carboxylic acids, an amine salt, such as alkyl amine salt and alkanolamine salt, of these carboxylic acids, and an ester compound of these carboxylic acids.

The above-mentioned organic substance included in the treatment agent used in the present invention preferably has about 1 to 25 carbons or a molecular weight of about 30 to 400 g/mol because the vaporization temperature of treated coating 2 can be confined within the range from 80 to 250° C.

The treatment agent can be prepared by solving the one or two kinds or more of the above-mentioned organic substances into water or alcohol.

The prepared treatment agent is applied, by a coating method such as dip coating, spin coating, spray coating, and coating by a brush, onto the surfaces of the circuit plate 1b, the metal plate 1c and the like of the multilayer substrate 1, to form a coating of the treatment agent.

The coating of the treatment agent is physically adsorbed onto the surfaces of circuit plate 1b, the metal plate 1c and the like. This situation is different from that of benzotriazole-based treatment agents conventionally used as rust preventives in that they are chemically adsorbed through a reaction with metal (such as copper) on the surfaces of the circuit plate 1b and metal plate 1c. The treated coating 2 covers the surfaces of the circuit plate 1b and the metal plate 1c and has a rust preventive function, enabling prevention of the circuit plate 1b and the metal plate 1c from chemical alteration such as oxidation and corrosion during storage or transport of the multilayer substrate 1.

The treated coating 2 provides a pristine exposed surface to the circuit plate 1b and the metal plate 1c after its vaporization by heating during solder-bonding because it usually does not contain flux components. Accordingly, it can provide satisfactory solder wettability during bonding. This means that reliable solder-bonding can be achieved even by using a plate solder which contains no flux components. Accordingly, the method for producing the member for semiconductor device of the present invention is remarkably effective when the plate solder is used as solder.

Since the treated coating 2 usually contains no flux components, atmosphere during solder-bonding is preferably made be a reductive atmosphere in order to carry out satisfactory solder-bonding. Examples of the reductive atmosphere specifically include atmospheres of $H_2$ gas and of a mixed gas of $H_2$ and $N_2$.

Embodiment 2

The above described Embodiment 1 is an example in which the first member is the multilayer substrate 1, but the method for producing a member for semiconductor device of the present invention is not limited to the case in which the first member is the multilayer substrate 1.

Figure 5:
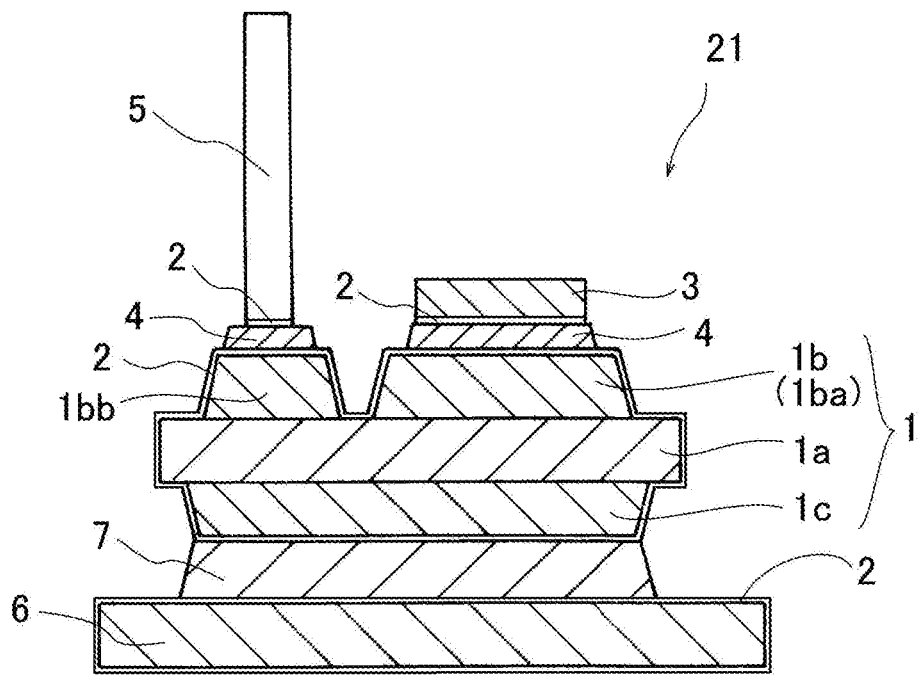
FIG. 5 is a schematic cross-sectional view of a main portion of a power semiconductor module during its assembly.

FIG. 5 illustrates a schematic cross-sectional view of a main portion of a power semiconductor module 21 during assembly. The multilayer substrate 1 in the figure has the same symbols as those of the multilayer substrate 1 in FIG. 3 because these substrates have a similar configuration. Accordingly a duplicated explanation for the multilayer substrate 1 will be omitted in the following explanations. The treated coating 2 covers the surfaces of the circuit plate 1b, the metal plate 1c, and the insulating plate 1a of the multilayer substrate 1.

The solder 4 is bonded between the front surface of a region 1ba of the circuit plate 1b of the multilayer substrate 1 and the back surface of the semiconductor chip 3. The solder 4 is bonded between the front surface of another region 1bb of the circuit plate 1b and the connection terminal 5. The solder 7 is bonded between the back surface of the metal plate 1c and the heat sink 6.

An electrode formed on the front surface of the semiconductor chip 3 may be solder-bonded to one end portion of the conductive post disposed on the electrode or be bonded to one end of a bonding wire.

Figure 6A:
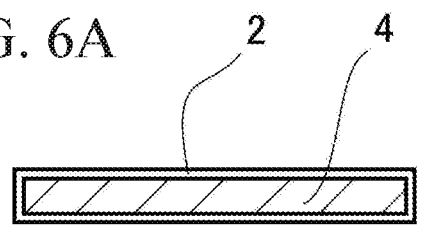
FIG. 6A is a schematic cross-sectional view of a solder covered with a treated coating.
Figure 6B:
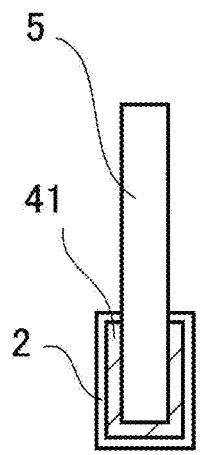
FIG. 6B is a schematic cross-sectional view of a connection terminal covered with the treated coating.

In the cross-sectional view illustrated in FIG. 5, the back electrode of the semiconductor chip 3 is covered by the treated coating 2. Further, the lower end of the connection terminal 5 is covered by the treated coating 2. Still further, the heat sink 6 is covered by the treated coating 2. Thus, the first member covered by the treated coating 2 via the surface-treatment with the treatment agent is not limited, in this embodiment, to the multilayer substrate 1, and may be at least one member selected from the semiconductor chip 3, the solder 4 (plate solder) disposed on the back surface of the semiconductor chip 3, the connection terminal 5, the heat sink 6, and the solder 7. The surface of the solder may be covered by the treated coating 2. FIG. 6A illustrates an example of the surface of the solder 4 (plate solder) covered by the treated coating 2, and FIG. 6B illustrates an example in which the surface of the connection terminal 5 covered by a solder 41 in advance is covered by the treated coating 2. In these cases, the solder itself corresponds to the first member.

The treated coating 2 covering these members has a function reducing chemical alteration of the surface of each of the members during their storage or transport. Further, during solder-bonding, since the treated coating vaporizes during temperature elevation from normal temperature before melting of the solder, generation of voids in the solder-bonded portions can be reduced. In this embodiment, members solder-bonded to the first members correspond to second members of the present invention. For example, when the heat sink 6 and the connection terminal 5 are the first members, the multilayer substrate 1 corresponds to the second member.

Next, a method for producing a semiconductor device using the member for semiconductor device will be explained. FIG. 7 illustrates a flow chart of the method for producing the semiconductor device. The semiconductor device is produced by a method including the step of preparing a member for semiconductor device including a first member including a metal portion, on the surface of which is formed a treated coating which vaporizes at a temperature lower than or equal to a solidus temperature of solder (S10), the step of disposing the first member and the second member in such a manner that the metal portion faces the second member across the treated coating (S20), and the step of heating and vaporizing the treated coating before melting the solder, and then melting the solder to bond the first member to the second member (S30).

In one example, the multilayer substrate 1 is prepared on which is formed the treated coating 2 as shown in FIG. 3 or FIG. 5, and then the multilayer substrate 1, the semiconductor chip 3, the connection terminal 5, and the heat sink 6 are disposed in such a manner that the circuit plate 1b faces the semiconductor chip 3 and the connection terminal 5 across the treated coating 2 and that the metal plate 1c also faces the heat sink 6 thereacross. In this case, the solder 4 and the solder 7 are further disposed between the treated coating 2 and both of the semiconductor chip 3 and the connection terminal 5 and between the treated coating 2 and heat sink 6, respectively. Then, the treated coating 2 is heated and vaporized before the solders 4 and 7 are molten, and then, solders 4 and 7 are molten to bond the multilayer substrate 1, the semiconductor chip 3, the connection terminal 5, and the heat sink 6.

In this case, the treated coating 2 may be formed in advance on the electrode of the semiconductor chip 3, the connection terminal 5, and the heat sink 6.

In another example, the solder 4 or the connection terminal 5 is prepared on which is formed the treated coating 2 illustrated in FIG. 6, and then the solder 4, the connection terminal 5, and other members are disposed in such a manner that the solder 4 faces the metal plate 1c or the heat sink 6 across the treated coating 2 and that the connection terminal 5 also faces the circuit plate 1b thereacross. Subsequently, the treated coating 2 is heated and vaporized before the solders 4 and 41 are molten, and then the solders 4 and 41 is molten to bond the solder 4 to the metal plate 1c or the heat sink 6, and the terminal 5 to the circuit plate 1b.

The production steps of the semiconductor device may include a step of coating the surface of the metal portion with a treatment agent to form the treated coating. In addition, the step of melting the solder to bond the first member to the second member may be carried out in a reductive atmosphere.

EXAMPLES

<Test 1>

Multilayer substrates 1, a treatment agent used as a treatment agent in the present invention, and a benzotriazole-based treatment agent conventionally used as a rust preventive were prepared. The treatment agent used in the present invention was a mixture of 1% by mass of methyl pentanoate purchased from JUNSEI CHEMICAL CO., LTD. and 99% by mass of pure water, adjusted to pH=11 with potassium hydroxide. The formed treated coating had a vaporization temperature within a range from 160 to 190° C. The benzotriazole-based treatment agent contained 2% by mass of 1,2,3-benzotriazole purchased from Tokyo Chemical Industry Co., Ltd., 25% by mass of isopropyl alcohol, 5% by mass of potassium hydroxide, and 68% by mass of pure water.

Example 1

The surface of a multilayer substrate 1 was coated with the treated coating 2 of the present invention as a treated coating, and the sample was then kept heated at 200° C. for 10 seconds.

Comparative Example 1

For comparison, the surface of multilayer substrates 1 were coated with a benzotriazole-based treated coating used conventionally as a rust preventive, and then one sample of them was kept heated at 200° C. for 10 seconds, and another sample was at 260° C. for 10 seconds, and still another sample was at 320° C. for 10 seconds.

The surface of the multilayer substrates 1 after the heating was analyzed by using XPS to obtain the semi-quantitative values of nitrogen element (N) and carbon element (C) on the surface.

Figure 8:
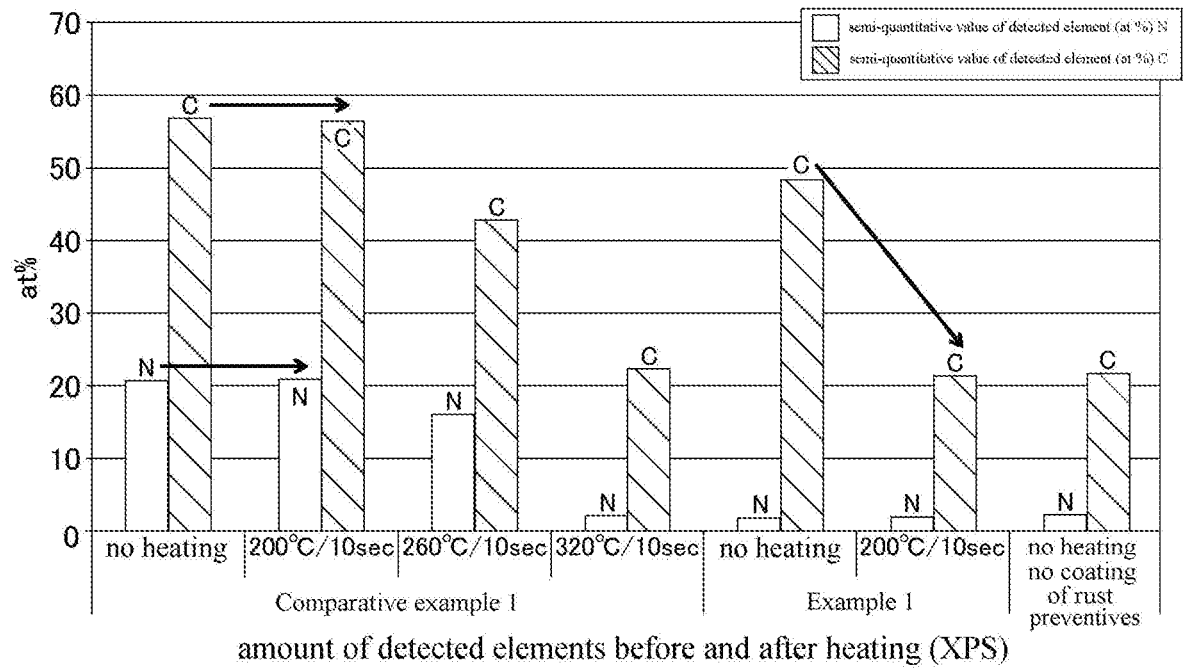
FIG. 8 is bar graph indicating a result from XPS analysis carried out for Example 1 and Comparative example 1.

The results are shown in Table 2 and also in FIG. 8 as a bar graph. In Table 2 and FIG. 8, referential results are also shown which were obtained by the analysis by using XPS from a multilayer substrate which was neither coated with any treatment agent nor heated.

TABLE 2

| kind of treated coating | temperature | duration | semi-quantitative value of detected elements (at %) | |
|---|---|---|---|---|
| | | | N | C |
| Conventional example 1 | no heating | | 21.8 | 56.9 |
| | 200° C. | 10 sec | 21.0 | 56.5 |
| | 260° C. | 10 sec | 16.2 | 43.1 |
| | 320° C. | 10 sec | 2.3 | 22.4 |
| Example 1 | no heating | | 2.0 | 48.5 |
| | 200° C. | 10 sec | 2.1 | 21.5 |
| no coating | no heating | | 2.4 | 21.9 |

Although the treated coating 2 used in the present invention was subjected to short heating at 200° C., a temperature lower than the onset temperature of solder melting, for 10 seconds, which modeled after a temperature elevation step of during solder-bonding, the treated coating exhibited, from Table 2 and FIG. 8, N and C in comparative amounts to those in the case of the multilayer substrate which was neither coated with any treatment agent nor heated. This result implied disappearance of the coating. In contrast to this, the benzotriazole-based treated coating exhibited, even after heating at 260° C. for 10 seconds, N and C in larger amounts than those in the case of the multilayer substrate which was neither coated with any treatment agent nor heated, suggesting insufficient vaporization. Further, the benzotriazole-based treated coating, after heating at 320° C. for 10 seconds, exhibited N and C in comparative amounts to those in the case of the multilayer substrate which was not heated, but the temperature of 320° C. was thought to be higher than the solidus temperature Ts of the solder.

<Test 2>

Example 2

When the power semiconductor module was assembled, the circuit plate 1b of the multilayer substrate 1 was surface-treated by the treatment agent in the present invention. The solder 4 was disposed on the post-surface-treated surface of the circuit plate 1b, and the semiconductor chip 3 was disposed in such a manner as to face the solder 4, followed by heating to 320° C. to bond the circuit plate 1b to semiconductor chip 3. The treatment agent was the same as that used in Test 1. The solder was a solder of Sn-3% Ag-0.5% Cu, and the solidus temperature was 217° C.

Comparative Example 2

For comparison, the circuit plate 1b and semiconductor chip 3 were solder-bonded in the same manner as that in Example 2 except that the circuit plate 1b of the multilayer substrate 1 was surface-treated by the benzotriazole-based treatment agent conventionally used as a rust preventive.

Voids in the solder-bonded portion between the circuit plate 1b and the semiconductor chip 3 were observed by using Scanning Acoustic Tomograph (SAT). The observation results were imaged to calculate the proportion of the area occupied by voids.

Figure 9:
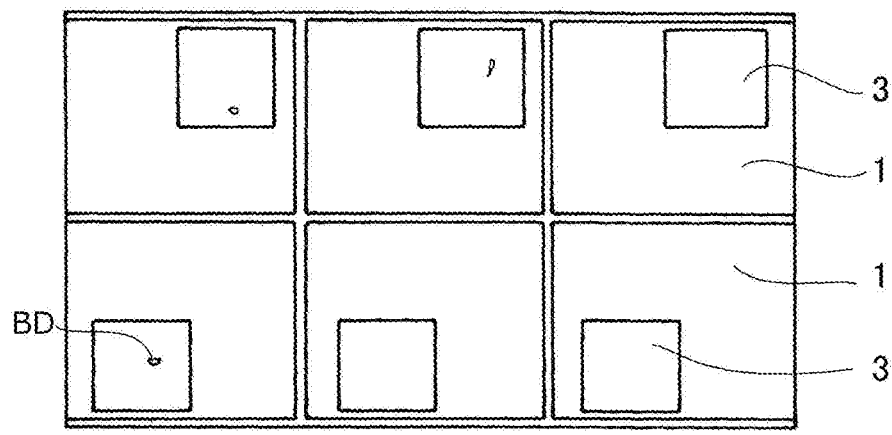
FIG. 9 is a drawing copied from an image obtained from an observation by using Scanning Acoustic Tomograph carried out for a sample of Example 2.
Figure 10:
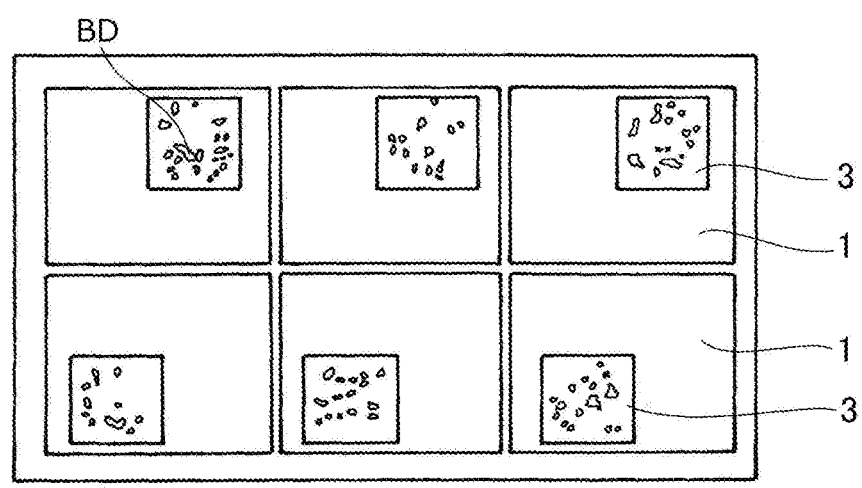
FIG. 10 is a drawing copied from an image obtained from the observation by using Scanning Acoustic Tomograph carried out for a sample of Comparative example 2.

Drawings copied from the observed images are shown in FIG. 9 and FIG. 10 for samples of Example 2 and Comparative example 2.

FIG. 9 and FIG. 10 are images of the power semiconductor module viewed in a direction perpendicular to the surface of the multilayer substrate 1 and show void BDs in the region of the semiconductor chip 3. FIG. 9 is a result of the surface treatment with the treatment agent of the present invention, and FIG. 10 is a result of the surface treatment with the benzotriazole-based treatment agent conventionally used as a rust preventive. Comparison of FIG. 9 with FIG. 10 reveals that Example 2 of the surface treatment by using the treatment agent used in the present invention exhibits a drastic decrease in void BDs in comparison to the Comparative example shown in FIG. 10. The proportion of the area occupied by the voids was 0.2% for Example 2 and 4.2% for Comparative example 2.

As described above, the method for producing a member for semiconductor device and the member for semiconductor device of the present invention were specifically explained by using the drawings and the embodiments, but the method for producing a member for semiconductor device and the member for semiconductor device of the present invention are not limited to the described embodiments and the drawings, and various modifications can be made within a scope not departing from the spirit of the present invention.

DESCRIPTION OF SYMBOLS 1 multilayer substrate
1a insulating plate
1b circuit plate
1c metal plate
2 treated coating
3 semiconductor chip
4 solder
5 connection terminal
6 heat sink
7 solder
21 power semiconductor module

The invention claimed is:

1. A member for semiconductor device, comprising:
a metal portion configured to be bonded to another member by solder, and
a treated coating covering a surface of the metal portion, the treated coating including a treatment agent comprising at least one organic substance selected from a metal salt of carboxylic acid and a carboxylic acid ester,
wherein the treated coating vaporizes at a temperature lower than or equal to a solidus temperature of the solder,
wherein the at least one organic substance is selected from a metal salt of fatty acid, and a fatty acid ester, and
wherein the organic substance is an alkaline metal salt including potassium salt and sodium salt of the carboxylic acid, the carboxylic acid including one of formic acid, acetic acid, propanoic acid, butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, icosanoic acid, propenoic acid, butenoic acid, pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, heptadecenoic acid, octadecenoic acid, nonadecenoic acid, icosenoic acid, 2-ethylhexanoic acid, oxalic acid, malonic acid, succinic acid, glutaric acid, adipic acid, pimelic acid, suberic acid, azelaic acid, sebacic acid, undecanedioic acid, dodecanedioic acid, tridecanedioic acid, tetradecanedioic acid, pentadecanedioic acid, hexadecanedioic acid, heptadecanedioic acid, phthalic acid, isophthalic acid, terephthalic acid, malic acid, and citric acid, or
an ester compound of the carboxylic acid including one of formic acid, acetic acid, propanoic acid, butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, icosanoic acid, propenoic acid, butenoic acid, pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, heptadecenoic acid, octadecenoic acid, nonadecenoic acid, icosenoic acid, 2-ethylhexanoic acid, oxalic acid, malonic acid, succinic acid, glutaric acid, adipic acid, pimelic acid, suberic acid, azelaic acid, sebacic acid, undecanedioic acid, dodecanedioic acid, tridecanedioic acid, tetradecanedioic acid, pentadecanedioic acid, hexadecanedioic acid, heptadecanedioic acid, phthalic acid, isophthalic acid, terephthalic acid, malic acid, and citric acid.

2. The member for semiconductor device according to claim 1, wherein a vaporization temperature of the treated coating is in a range from 80 to 250° C.

3. The member for semiconductor device according to claim 1, wherein the organic substance comprises 1 to 25 carbons.

4. The member for semiconductor device according to claim 1, wherein the organic substance has a molecular weight from 30 to 400 g/mol.

5. The member for semiconductor device according to claim 1, wherein the treatment agent comprises the at least one organic substance, and water or alcohol dissolving the at least one organic substance.

6. The member for semiconductor device according to claim 1, wherein the treated coating of the treatment agent is physically adsorbed onto the surface of the metal portion.

7. The member for semiconductor device according to claim 1, wherein the member is at least one member selected from a semiconductor chip, a multilayer substrate, a heat sink, a solder and a connection terminal, and including the metal portion.

8. The member for semiconductor device according to claim 1, wherein the member is a multilayer substrate including the metal portion and an insulating plate, wherein the metal portion comprises at least one of a circuit plate and a metal plate, wherein the circuit plate is deposited on one surface of the insulating plate, and the metal plate is deposited on another surface of the insulating plate, wherein the treated coating is formed on a surface of at least one of the circuit plate and the metal plate.

9. A member for semiconductor device, comprising:
a metal portion configured to be bonded to another member by solder, the metal portion including an insulating plate, a circuit plate deposited on one surface of the insulating plate, and a metal plate deposited on another surface of the insulating plate, and
a treated coating completely covering surfaces of the metal portion device and reducing chemical alteration on the surfaces of the metal portion, the treated coating including a treatment agent comprising at least one organic substance selected from a metal salt of carboxylic acid and a carboxylic acid ester,
wherein the treated coating vaporizes at a temperature lower than or equal to a solidus temperature of the solder, so that the treated coating finishes vaporization during a temperature elevation and after onset of melting of the solder, the treated coating does not remain on the surfaces of the member for semiconductor device,
wherein the at least one organic substance is selected from a metal salt of fatty acid, and a fatty acid ester, and
wherein the organic substance is an alkaline metal salt including potassium salt and sodium salt of the carboxylic acid, the carboxylic acid including one of formic acid, acetic acid, propanoic acid, butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, icosanoic acid, propenoic acid, butenoic acid, pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, heptadecenoic acid, octadecenoic acid, nonadecenoic acid, icosenoic acid, 2-ethylhexanoic acid, oxalic acid, malonic acid, succinic acid, glutaric acid, adipic acid, pimelic acid, suberic acid, azelaic acid, sebacic acid, undecanedioic acid, dodecanedioic acid, tridecanedioic acid, tetradecanedioic acid, pentadecanedioic acid, hexadecanedioic acid, heptadecanedioic acid, phthalic acid, isophthalic acid, terephthalic acid, malic acid, and citric acid, or an ester compound of the carboxylic acid including one of formic acid, acetic acid, propanoic acid, butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, icosanoic acid, propenoic acid, butenoic acid, pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, heptadecenoic acid, octadecenoic acid, nonadecenoic acid, icosenoic acid, 2-ethylhexanoic acid, oxalic acid, malonic acid, succinic acid, glutaric acid, adipic acid, pimelic acid, suberic acid, azelaic acid, sebacic acid, undecanedioic acid, dodecanedioic acid, tridecanedioic acid, tetradecanedioic acid, pentadecanedioic acid, hexadecanedioic acid, heptadecanedioic acid, phthalic acid, isophthalic acid, terephthalic acid, malic acid, and citric acid.

* * * * *